(12) United States Patent
Happ et al.

(10) Patent No.: US 7,796,424 B2
(45) Date of Patent: Sep. 14, 2010

(54) MEMORY DEVICE HAVING DRIFT COMPENSATED READ OPERATION AND ASSOCIATED METHOD

(75) Inventors: Thomas Happ, Tarrytown, NY (US); Jan Boris Philipp, Peekskill, NY (US)

(73) Assignee: Qimonda North America Corp., Cary, NC (US)

( * ) Notice: Subject to any disclaimer, the term of this patent is extended or adjusted under 35 U.S.C. 154(b) by 287 days.

(21) Appl. No.: 11/766,566

(22) Filed: Jun. 21, 2007

(65) Prior Publication Data
US 2008/0316802 A1    Dec. 25, 2008

(51) Int. Cl.
*G11C 11/00* (2006.01)

(52) U.S. Cl. .................. 365/163; 365/148; 365/205

(58) Field of Classification Search ................. 365/163, 365/148, 230.06, 205
See application file for complete search history.

(56) References Cited

U.S. PATENT DOCUMENTS

2006/0285408 A1* 12/2006 Betser et al. ................. 365/212
2007/0211512 A1*  9/2007 Shuto ........................ 365/145

OTHER PUBLICATIONS

"Highly Manufacturable High Density Phase Change Memory of 64Mb Nb Beyond", S.J. Ahn, Y.J. Song, C.W. Jeong, J.M. Shin, Y. Fai, Y.N. Hwang, S.H. Lee, K.C. Ryoo, S.Y. Lee, J.H. Park, H. Horii, Y.H. Ha, J.H. Yi, B.J. Kuh, G.H. Koh, G.T. Jeong, H.S. Jeong, Kinam Kim and B.I. Ryu, IEEE, International Electron Devices Meeting, 2004, 4 pgs.

"Novel One-Mask Self-Heating Pillar Phase Change Memory", T.D. Happ, M. Breitwisch, A. Schrott, J.B. Philipp, M.H. Lee, R. Cheek, T. Nirschl, M. Lamorey, C.H. Ho, S.H. Chen, C.F. Chen, E. Joseph, S. Zaidi, G.W. Burr, B. Yee, Y.C. Chen, S. Raoux, H.L. Lung, R. Bergmann and C. Lam, IEEE, Symposium on VLSI Technology Digest of Technical Papers, 2006, 2 pgs.

"Current Status of the Phase Change Memory and its Future", Stefan Lai, International Electron Devices Meeting, 2003, 4 pgs.

"OUM—A 180 nm Nonvolatile Memory cell Element Technology for Stand Alone and Embedded Applications", Stefan Lai and Tyler Lowrey, International Electron Devices Meeting, 2001, 4 pgs.

\* cited by examiner

*Primary Examiner*—Huan Hoang
(74) *Attorney, Agent, or Firm*—Eschweiler & Associates, LLC

(57) ABSTRACT

A memory includes a memory array and a read control circuit configured to effectuate a read operation of a memory cell in the array. The read control circuit is configured so that the read operation contemplates one or more drift conditions associated with the memory cell. A method of reading a memory cell is also disclosed and includes detecting one or more drift conditions of a memory cell, and setting one or more read reference levels based on the one or more detected drift conditions. The memory cell is then read using the set one or more read reference levels.

10 Claims, 5 Drawing Sheets

MEMORY DEVICE HAVING DRIFT COMPENSATED READ OPERATION AND ASSOCIATED METHOD

BACKGROUND OF THE INVENTION

In the case of conventional memory devices, in particular conventional semiconductor memory devices, it is sometimes common to differentiate between functional memory devices (e.g., PLAs, PALs, etc.) and table memory devices. For example, some table memory devices include ROM devices (Read Only Memory) and RAM devices (Random Access Memory or read-write memory) such as DRAMs and SRAMs.

In the case of SRAMs (Static Random Access Memory), individual memory cells typically comprise, for example, six transistors configured as a cross-coupled latch. In the case of DRAMs (Dynamic Random Access Memory), generally only one single, correspondingly controlled capacitive element (e.g., the gate-source capacitance of a MOSFET) is employed, wherein charge may be stored in the capacitance. The charge in a DRAM, however, remains for only a short time, and a periodic refresh must be performed, to maintain a data state. In contrast to the DRAM, the SRAM requires no refresh, and the data stored in the memory cell remains stored as long as an appropriate supply voltage is fed to the SRAM. Both SRAMs and DRAMs are considered volatile memories, wherein a data state is only retained as long as power is supplied thereto.

In contrast to volatile memory, non-volatile memory devices (NVMs) exhibit a different property, wherein the stored data is retained even when the supply voltage associated therewith is switched off. This type of memory has several advantages for various types of mobile communications devices such as, for example, in an electronic rolodex on cell phones, wherein the data therein is retained even when the cell phone is turned off.

One type of non-volatile memory is called resistive or resistively switching memory devices. In such a resistive memory, a memory material positioned between two appropriate electrodes (i.e., an anode and a cathode) is placed, by appropriate switching processes, in a more or less conductive state, wherein the more conductive state corresponds, for example, to a logic "1", and the less conductive state corresponds, for example, to a logic "0" (or vice versa). Suitable resistive memories can be, for example, perovskite memory, as described in W. W. Zhuang et al., "Novel Colossal Magnetoresistive Thin Film Nonvolatile Resistance Random Access Memory (RRAM)", IEDM 2002, resistive switching in binary oxides (OxRAM), for example, as described in I. G. Baek et al., "Multi-layer crosspoint binary oxide resistive memory (OxRAM) for post-NAND storage application", IEDM 2005, phase change memory (PCRAM), and conductive bridging RAM (CBRAM), as described in M. Kund et al., "Conductive bridging RAM (CBRAM): An emerging non-volatile memory technology scalable to sub 20 nm", IEDM, 2005.

In the case of phase change memory, an appropriate chalcogenide compound (e.g., a GeSbTe or an AgInSbTe compound) may, for instance, be used as the active material that is positioned between the two corresponding electrodes. The chalcogenide compound material can be placed in an amorphous, i.e., relatively weakly conductive, or a crystalline, i.e., relatively strongly conductive state by means of appropriate switching processes, and thus behaves like a variable resistance element, which as highlighted above, may be exploited as differing data states.

In order to achieve a change in the phase change material from an amorphous state to a crystalline state, an appropriate heating current is applied to the electrodes, wherein the current heats the phase change material beyond the crystallization temperature thereof. This operation is sometimes called a SET operation. Similarly, a change of state from a crystalline state to an amorphous state is achieved by application of an appropriate heating current pulse, wherein the phase change material is heated beyond the melting temperature thereof, and the amorphous state is obtained during the rapid cooling process thereof. This operation is sometimes called a RESET operation. The combination of SET and RESET operations is one means by which data can be written to a phase change memory cell.

Conventionally, resistively switched memories such as phase change memory devices are organized in one or more arrays of phase change cells in a core area of the device, wherein each phase change memory cell is composed of a phase change memory element coupled to a selection switching device. One conventional arrangement is illustrated in FIG. 1, wherein a phase change element 10 is coupled between a bit line 12 and a bipolar select transistor 14. A word line 16 is coupled to the base terminal of the transistor 14. By properly addressing the bit line 12 and word line 16 associated therewith, data may be written thereto and read therefrom. An array of phase change memory cells configured in the manner described above is sometimes called a NOR type memory array.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In one embodiment of the invention, a memory device and associated method are disclosed that take into account one or more drift conditions associated with a memory cell when performing a read operation. Such memory cells may comprise binary state memory devices or multi-level (multi-state) type memory devices.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1:
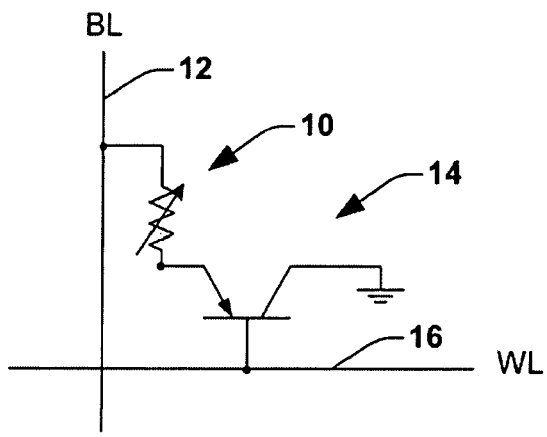
FIG. 1 is a schematic diagram illustrating a conventional memory architecture employing a select transistor for selective access to a memory element associated therewith.

One or more implementations of the present invention will now be described with reference to the attached drawings, wherein like reference numerals are used to refer to like elements throughout. The invention relates to a memory device and a method of reading a memory cell that improves reliability by taking into consideration one or more drift conditions associated with the memory cell.

Figure 2:
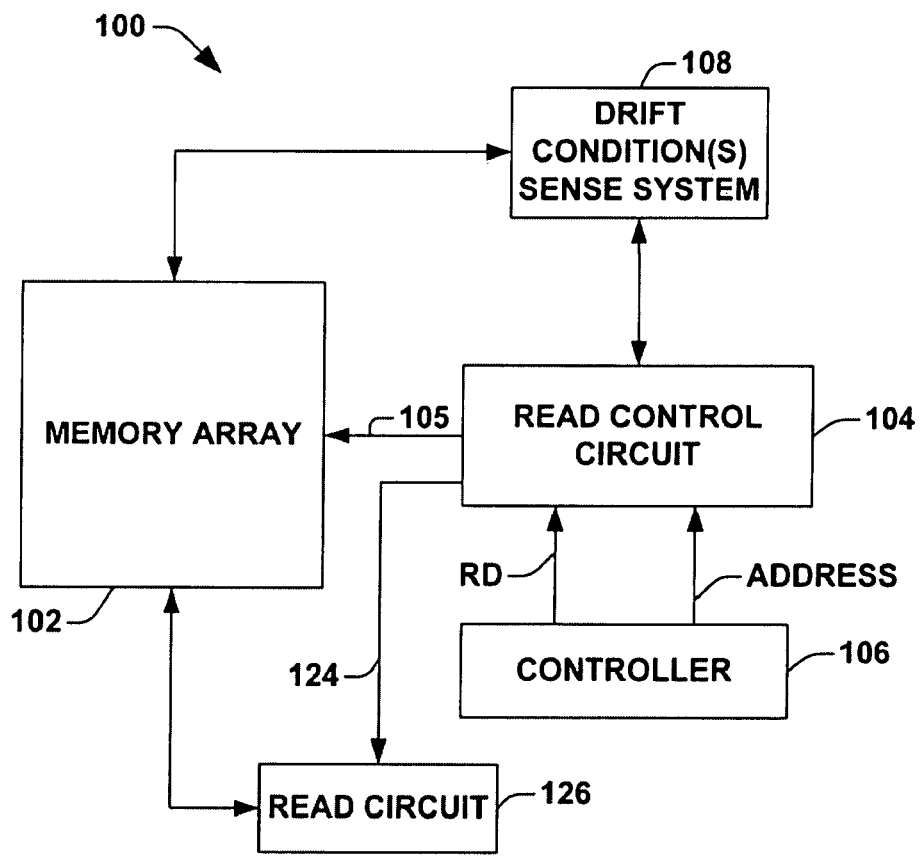
FIG. 2 is a block diagram illustrating a memory operable to detect drift conditions and use such detected drift conditions in reading a memory cell to improve a reliability thereof according to one embodiment of the invention.

One embodiment of a memory device is illustrated in FIG. 2. The memory device 100 comprises a memory array 102, for example, an M×N array of phase change memory cells. Such memory cells may comprise binary state memory cells or multi-level (multi-state) type memory cells. Further, while various embodiments herein describe the memory device 100 using phase change memory cells, it should be understood that any type memory device and architecture that experiences one or more drift conditions is contemplated as falling within the scope of the present invention.

A read control circuit 104 is operably coupled to the memory array 102, and is configured to execute appropriate read control signals 105 to appropriate word lines and bit lines based on receipt of a read control signal (RD) and a corresponding address (ADDRESS) from a controller 106. In addition, the memory device 100 comprises a drift conditions sense system 108 that is configured to ascertain one or more drift conditions associated with the memory array 102.

Figure 3:
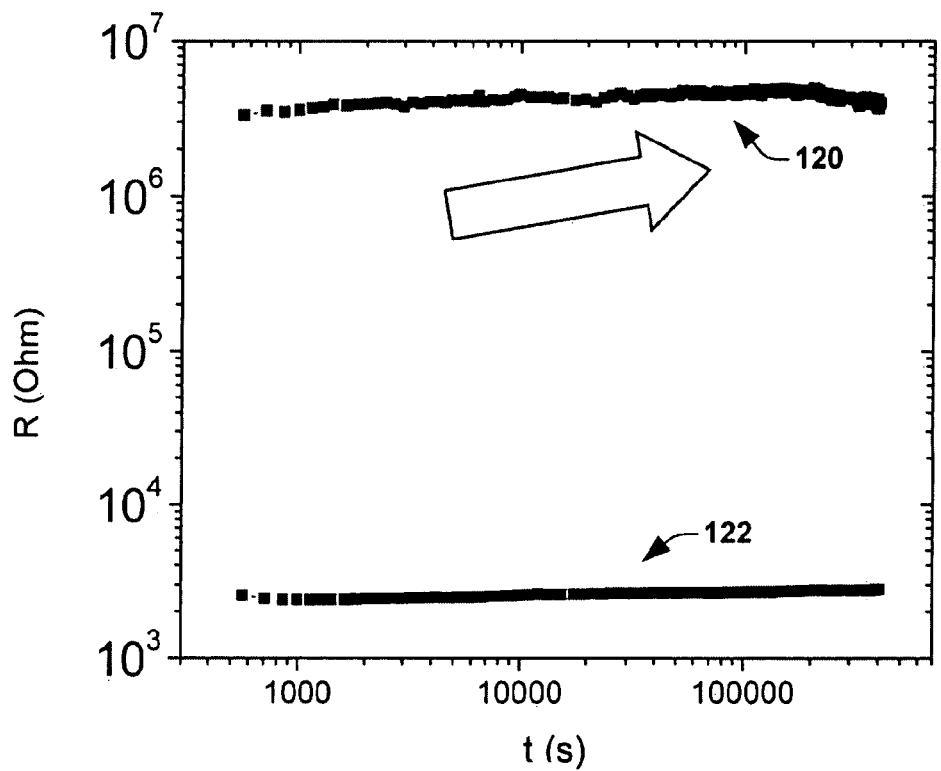
FIG. 3 is a graph illustrating an impact of carrier relaxation on a phase change memory cell according to one embodiment of the invention.

In one embodiment of the invention, the drift conditions sense system 108 is configured to detect carrier relaxation of a memory cell in the array 102. For example, for phase change memory cells at a relatively low temperature such as room temperature, the amorphous state (or higher resistance states in a multi-level device) of the cell will experience an increase in resistance (a decrease in conductivity) over time. For example, referring generally to FIG. 3, a binary state memory cell exhibiting carrier relaxation is illustrated, wherein an amorphous (or RESET) state 120 experiences an increase in resistivity over time. Comparatively speaking, the crystalline (or SET) state 122 does not experience the same amount of drift due to carrier relaxation as the amorphous state. This phenomenon is believed to be a function of the large number of dangling bonds and defects in the amorphous state getting populated over time and thus no longer being available for carrier movement through the material. Consequently, the resistance of the amorphous state increases over time. While the example illustrated in FIG. 3 shows a binary phase change memory cell, it should be understood that the carrier relaxation phenomena is existent in multi-state phase change cells that employ a plurality of increasingly amorphous (or resistive states) between the SET and RESET states shown in FIG. 3. In one embodiment of the invention, for each increasingly amorphous state the amount of carrier relaxation increases, wherein the slopes of the data would increase for increasingly amorphous states.

The drift conditions sense system 108 of FIG. 2 is operable to ascertain carrier relaxation and provide such data to the read control circuit 104. In one embodiment of the invention, the drift conditions sense system 108 ascertains carrier relaxation by keeping track of an amount of time since the memory cell at a given address was last programmed. Then at the time of a read of that particular memory cell, the drift conditions sense system 108 provides that information to the read control circuit 104, which then uses such information to more reliably read the data in that cell. In one embodiment of the invention, the drift conditions sense system 108 employs a timer circuit or counter circuit in assessing carrier relaxation, however, any circuitry to assess carrier relaxation may be employed and is contemplated as falling within the scope of the invention.

In one embodiment of the invention, the read control circuit 104 takes the carrier relaxation data associated with the particular address, and provides one or more read control signals 124 to a read circuit 126. In one embodiment, the read circuit 126 then modifies the sense amplifier reference levels to maintain approximately the same read margin as would exist if no carrier relaxation occurred. Alternatively, if the read margin cannot necessarily be maintained, the reference levels are selected so as to at least maximize the available read margin. The read circuit 126 then senses the current or voltage associated with the memory cell at the specified address using the modified reference level(s) to ascertain the state of the memory cell. For example, if the sense amplifier employs current sensing, one or more altered reference currents are utilized. Alternatively, if the sense amplifier employs voltage sensing, one or more altered reference voltages are utilized to ascertain the state of the cell.

In another embodiment of the invention, the read control circuit 104 may take the drift condition data and bias the appropriate bit lines and/or word lines via the control lines 105 instead or, or in addition to, altering reference sense levels in order to maximize the available read margin.

In another embodiment of the invention, the read control circuit 104 may take the time information from the drift conditions sense system 108 and institute a periodic refresh of either designated sectors or pages, or the entire array to eliminate the impact of the drift. In one embodiment of the invention, a timer may be employed to dictate a periodic refresh of the data on a daily basis, a weekly basis, a monthly basis or any other predetermined time period. If at the time of the dictated periodic refresh, power is not available to the memory device, the sense reference levels may be varied accordingly, and a refresh may then be scheduled to occur at the next power up.

Figure 4:
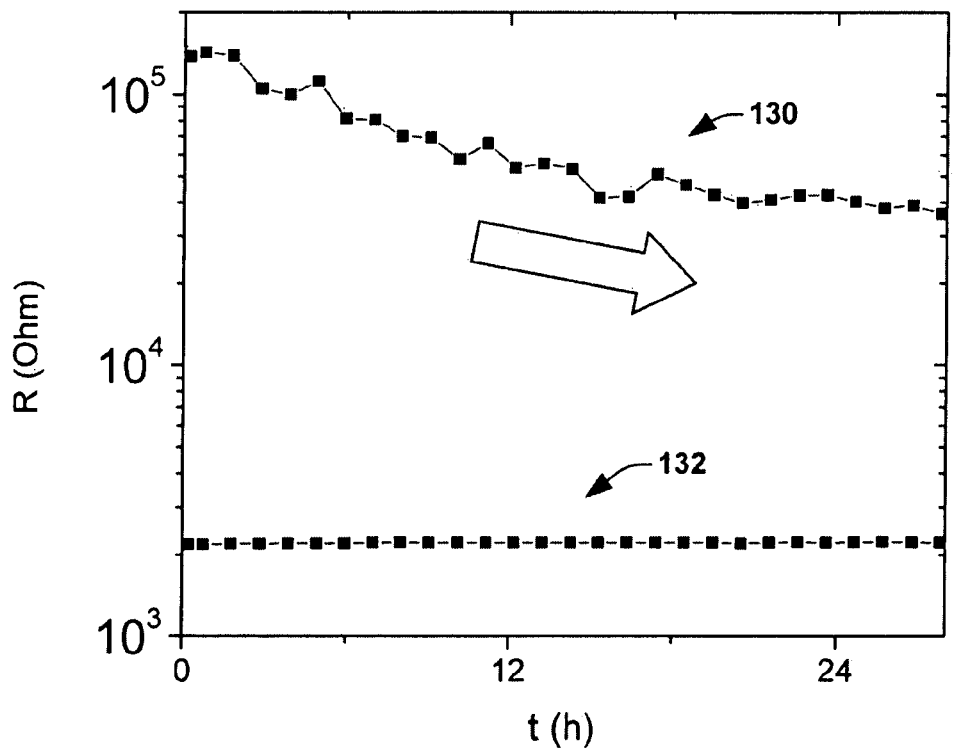
FIG. 4 is a graph illustrating an impact of slow crystallization on a phase change memory cell according to one embodiment of the invention.

In accordance with another embodiment of the invention, the drift conditions sense system 108 is operable to ascertain a slow crystallization phenomena associated with phase change reference cells. Referring generally to FIG. 4, at relatively low temperatures, slow crystallization occurs, but is almost negligible; however, at elevated temperatures such as 120 C, slow crystallization causes amorphous states 130 to experience reduced resistivity (increased conductivity) over time. As the term implies, the temperature causes the amorphous material to slowly crystallize, thus causing the material to be less amorphous. As can be appreciated in FIG. 4, for phase change material already in a substantially crystalline state at 132, the amount of crystallization is substantially reduced. Although not shown in FIG. 4, for a multi-state phase change memory cell, for increasingly amorphous intermediate states, the negative slope in the resistance graph will get more steep, indicating that the more amorphous the material initially is, the greater amount of slow crystallization is experienced.

In one embodiment of the invention, the drift conditions sense system 108 employs a temperature sensor and a timer to ascertain an amount of time a programmed cell has been at a temperature in which slow relaxation may have impacted the state of the particular memory cell. In one embodiment, the temperature sensor may comprise a diode structure or other circuit having a substantially well-defined temperature coefficient or other type well-defined thermal behavior to ascertain temperature. Alternatively, a reference cell containing one or more pre-defined reference states can be used to ascertain temperature. Any type of thermal sense device or circuit may be utilized and is contemplated as falling within the scope of the present invention. In addition, multiple temperature sensors may be employed across the memory array 102 so as to allow temperature sensing that is substantially localized to the desired address, if modest thermal gradients are anticipated across the array, or in order to collect an average temperature.

The read control circuit 104 receives the slow crystallization information and generates one or more control signals 124 to the read circuit 126. The read circuit 126 then alters its sense amplifier reference levels in order to substantially maintain a desired read margin, and thus compensate for the slow crystallization.

As can be seen in FIGS. 3 and 4, carrier relaxation and slow crystallization affect increasingly amorphous states in different ways. Generally speaking, at relatively low temperatures such as room temperature, the carrier relaxation phenomenon dominates. In contrast, at relatively high temperatures such as 120 C the slow crystallization phenomenon dominates. At an intermediate temperature, for example at around 50 C, the two phenomena substantially balance each other, wherein at short time periods the relaxation initially dominates, and then for longer periods of time the slow crystallization may dominate. In one embodiment of the invention the memory cells may be characterized and both phenomena taken into account according to a predetermined algorithm based on the characterization, or using various weighting factors. Accordingly, one or both phenomena may be monitored and used in altering reference levels, and all such alternatives and variations are contemplated as falling within the scope of the present invention.

Figure 5:
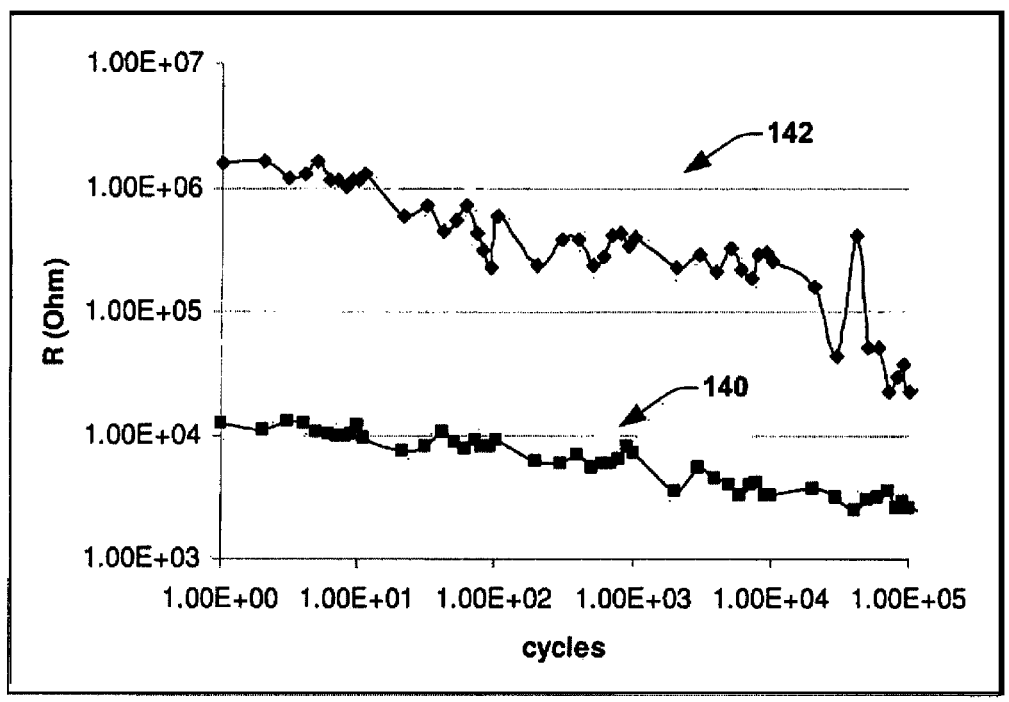
FIG. 5 is a graph illustrating an impact of write cycle history on a phase change memory cell according to another embodiment of the invention.

Referring again to FIG. 2, the drift conditions sense system 108 is further configured to monitor a write cycling drift condition associated with a memory cell. As can be seen in FIG. 5, for a phase change memory cell, the number of write cycles associated with the cell affects the resistivity of both crystalline and amorphous states 140 and 142. In accordance with one embodiment of the invention, a single write cycle comprises the programming of the cell to the RESET state, followed by programming to the SET state. Alternatively, however, a write cycle can be defined in numerous different ways and all such differing ways of defining a write cycle is contemplated as falling within the scope of the present invention.

As can be seen in FIG. 5, as the number of times data is written to the cell increases, the resultant resistivity associated with that intended data state decreases. Consequently, by keeping an approximate count of the number of write cycles associated with a memory cell, the read control circuit 104 of FIG. 2 can generate control signals 124 to alter read sense reference levels accordingly, so as to ensure read reliability.

In one embodiment of the invention, the drift conditions sense system 108 keeps track of the number of times data has been written to a predetermined portion of the memory array, such as a page or sector of the memory. If the address provided by the controller 106 is then associated with that portion of the array, the read control circuit 104 uses the write cycle data for that portion of the memory array 102 to generate control signals 124 to the read circuit 126. The read circuit 126 then alters the sense reference levels accordingly in order to increase the read reliability.

Figure 6:
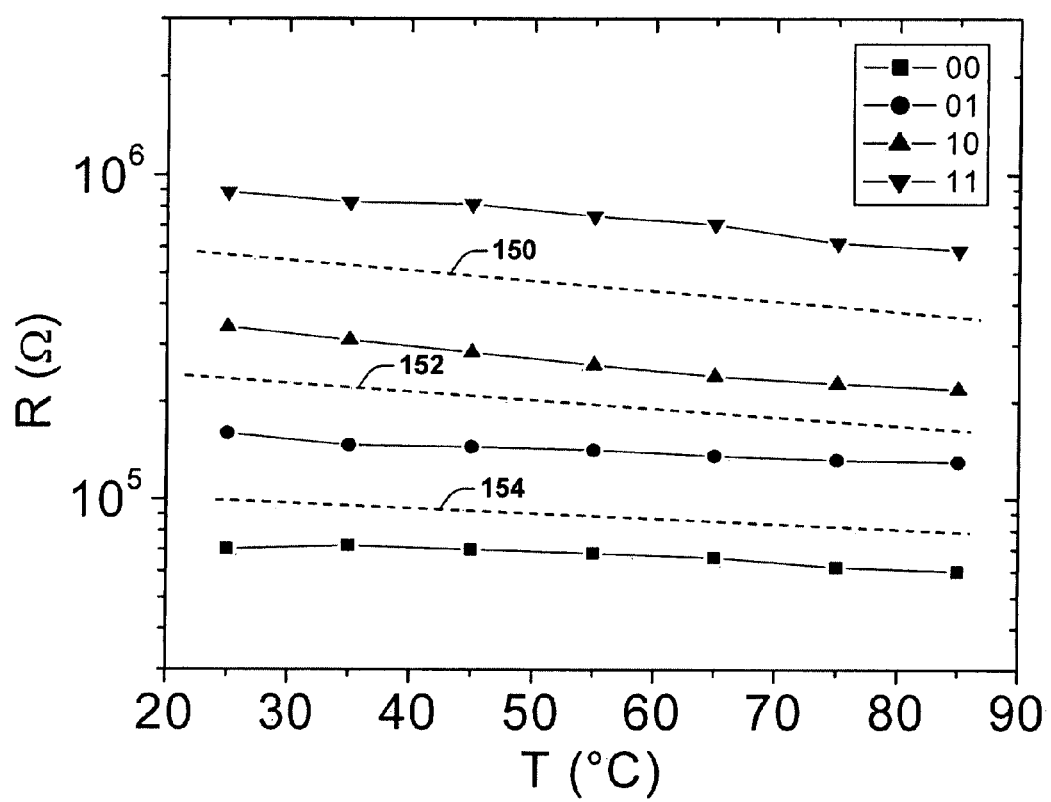
FIG. 6 is a graph illustrating an impact of mobile carrier density on a phase change memory cell according to still another embodiment of the invention.

In still another embodiment of the invention, the drift conditions sense system 108 is configured to monitor the effect of mobile carrier density in the memory cells of the array. As illustrated in FIG. 6, the resistivity of various states of a multi-state phase change memory cell is shown for various different temperature conditions. While temperature was discussed supra in conjunction with crystallization phenomena, temperature also plays another, distinct role in affecting the mobile carrier density in the conduction band of the phase change material. As can be seen in FIG. 6, as the temperature increases, the resistivity for each state decreases (the conductivity increases). This is because at increasing temperatures the mobile carrier density increases in the conduction band of the material.

In one embodiment of the invention, the drift conditions sense system 108 comprises one or more temperature sensors configured to determine a temperature associated with the memory cell being read in the memory array 102. The read control circuit 104 takes the temperature data and generates one or more control signals 124 for the read circuit 126 to use in generating appropriate read sense levels. As illustrated in FIG. 6, three different read sense level lines 150, 152, 154 are shown that attempt to maintain sufficient read margin between each of the states for all temperatures. As can be appreciated from FIG. 6, if the lines 150, 152, 154 remained constant for all temperatures the read margins across temperature would vary substantially, causing read reliability to be degraded at one or more temperatures. Therefore the invention contemplates control signals that alter the reference levels based on the monitored drift condition so as to maximize the available read margin. As can be appreciated, the read sense level lines 150, 152, 154 correspond to different current or voltage reference levels that are altered in the sense amplifier(s) of the read circuit 126.

Figure 7:
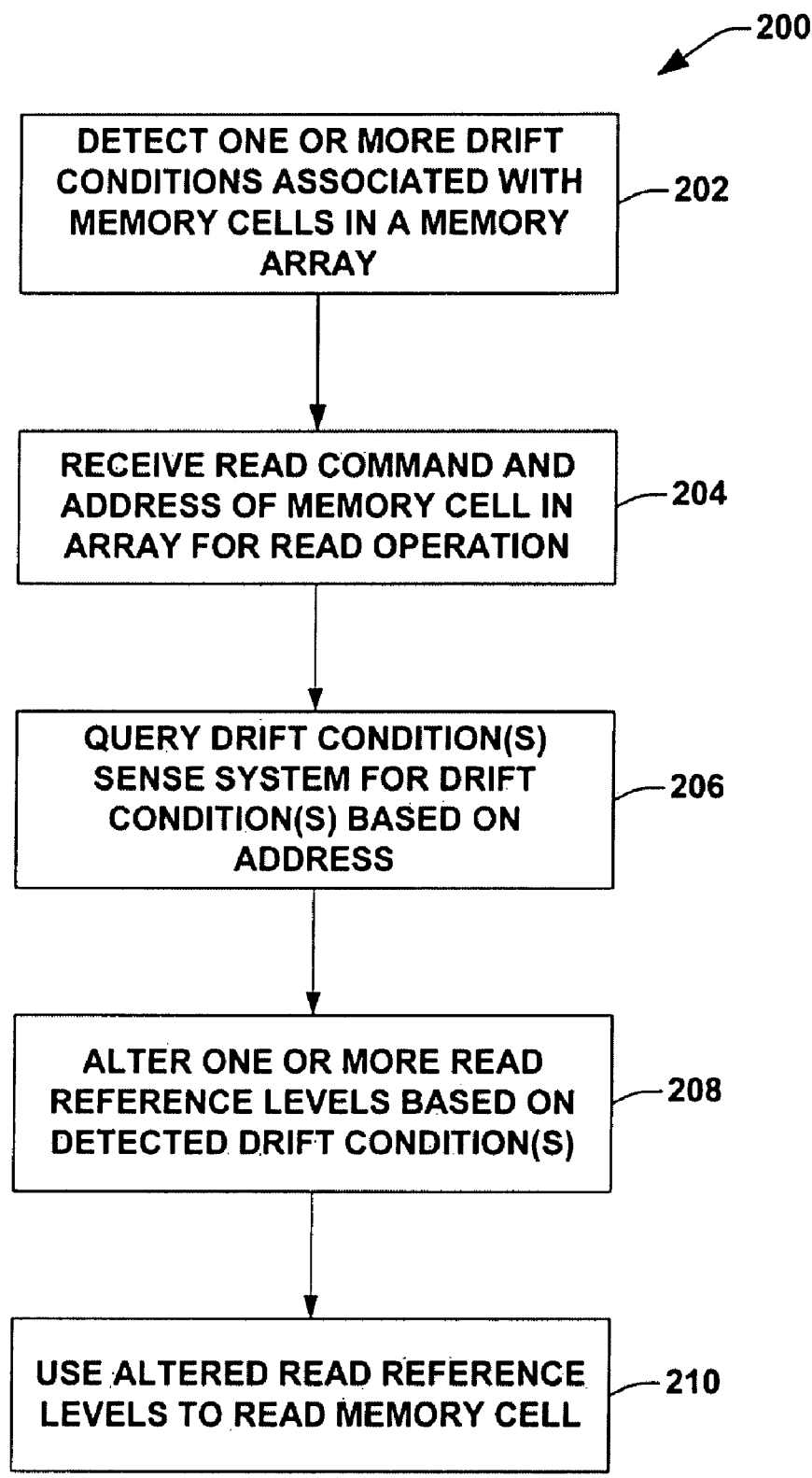
FIG. 7 is a flow chart illustrating a method of reading a memory cell that takes into account one or more drift conditions associated therewith according to one embodiment of the invention.

Turning to FIG. 7, a method 200 of performing a read operation that takes into account drift conditions is provided according to one embodiment of the invention. While the method 200 and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated actions may be required to implement a methodology in accordance with the invention.

Initially, at 202 one or more drift conditions associated with a memory cell, such as a phase change memory cell, in a memory array are detected. Examples of drift conditions that may be detected include, but are not limited to, carrier relaxation, slow crystallization, write cycle life, and mobile carrier density. Any manner of detecting such drift conditions may be employed and such detection functions are contemplated as falling within the scope of the invention. For example, thermal conditions may be monitored in one or more locations about the memory array, and such monitoring may be performed in any acceptable fashion. For example, a thermal detection circuit may include a diode or other type circuit or structure that has a well characterized temperature coefficient behavior.

In another embodiment of the invention, counters and/or timers may be employed to ascertain time periods associated with a memory cell, or to count a number of write cycles associated with a portion of the memory array. For example, a timer may be employed to determine how long a given cell has been in a given state at the time of a read operation to account for carrier relaxation. In addition, multiple drift conditions can be detected in a concurrent fashion and such drift conditions employed together to evaluate a memory cell condition such as slow crystallization using both time and temperature information.

At 204 a read command and an address of a memory cell to be read is received. For example, as illustrated in FIG. 2, one example is receipt of a read command (RD) and an address (ADDRESS) received from a controller. Based on the read command and the appropriate address for the read operation, the appropriate drift conditions are ascertained at 206. In one embodiment this act may comprise retrieving the relevant drift condition or conditions from the drift conditions sense system 108 of FIG. 2.

The relevant ascertained drift conditions are then utilized to alter or set one or more read reference levels for circuitry employed in the read operation of the cell at 208. In one embodiment act 208 comprises altering reference current levels or reference voltage levels associated with sense amplifier circuitry. In one embodiment one reference level may be altered from a standard default reference value for a binary state phase change memory cell. Alternatively, multiple reference levels may vary for a multi-state phase change memory cell. In addition, instead of, or in addition to, varying reference levels, bit line and/or word line biasing may be altered to provide improved read margins and thus improve read reliability.

The altered reference levels are then used in the read circuit to read the specified memory cell at 210. Because the altered reference levels contemplate the one or more detected drift conditions, the read reliability is substantially improved since the read margins are optimized or at least improved by the altered reference levels. In the above manner, any ECC (error correction coding) that is employed to correct defective data will be substantially more effective, since the number of failed bits is substantially reduced and thus maintained with correctable limits that is correctable by the ECC.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A memory, comprising:
a memory array;
a read control circuit configured to effectuate a read operation of a memory cell in the array, wherein the read operation contemplates one or more drift conditions associated with the memory cell, and
wherein:
the drift conditions comprise one or more of carrier relaxation of material within the memory cell, slow crystallization of material within the memory cell, mobile carrier density of material within the memory cell, and cycling endurance of the memory cell, or
the read control circuit contemplates the one or more drift conditions by altering one or more of a bit line and word line biasing based on the contemplated one or more drift conditions, or
the read control circuit contemplates the one or more drift conditions by performing a periodic refresh of at least a portion of the memory array after an elapsement of a predetermined time period.

2. The memory of claim 1, wherein the memory cell comprises a binary state or multi-level phase change memory cell.

3. A memory, comprising:
a memory array;
a drift condition sense system configured to ascertain one or more drift conditions associated with the memory array;
a read control circuit configured to effectuate a read operation of a memory cell in the array based on at least one ascertained drift condition provided by the drift condition sense system; and
wherein:
the memory cell comprises a phase change memory cell, and wherein the read circuit is configured to increase a reference level for one or more increasingly amorphous states when the at least one ascertained drift condition comprises a carrier relaxation of phase change material in the phase change memory cell; or
the memory cell comprises a phase change memory cell, and wherein the read circuit is configured to decrease a reference level for one or more increasingly amorphous states when the at least one ascertained drift condition comprises a slow crystallization of phase change material in the phase change memory cell; or
the memory cell comprises a phase change memory cell, and wherein the read circuit is configured to decrease a reference level for one or more increasingly amorphous states when the at least one ascertained drift condition comprises a number of write cycles associated with a portion of the memory array in which the phase change memory cell resides is greater than a predetermined threshold; or
the memory cell comprises a phase change memory cell, and wherein the read circuit is configured to alter one or more reference levels when the at least one ascertained drift condition comprises both a time period associated with when the phase change memory cell was last programmed, and a temperature associated with the phase change memory cell.

4. The memory of claim 3, further comprising a read circuit configured to read the memory cell using a particular set of one or more reference sense levels based on the at least one ascertained drift condition.

5. A method of reading a memory cell, comprising:
detecting one or more drift conditions of a memory cell;
setting one or more read reference levels or biasing one or more of a bit line and a word line associated with the memory cell based on the one or more detected drift conditions; and reading the memory cell using the set one or more read reference levels or the biased bit line and/or word line, and wherein detecting the one or more drift conditions comprises determining a number of write cycles associated with a portion of a memory array in which the memory cell resides, or wherein setting the one or more read reference levels comprises altering one or more default read reference levels based on the one or more detected drift conditions, or further comprising performing a periodic refresh of at least a portion of the memory array after an elapsement of a predetermined time period.

6. The method of claim 5, wherein detecting the one or more drift conditions comprises sensing a temperature associated with the memory cell.

7. The method of claim 5, wherein detecting the one or more drift conditions comprises determining a time period associated with when the memory cell was last programmed.

8. A system containing memory, the system comprising:

a memory array;

a read control circuit configured to effectuate a read operation of a memory cell in the array, wherein the read operation contemplates one or more drift conditions associated with the memory cell; and wherein:

the drift conditions comprise one or more of carrier relaxation of material within the memory cell, slow crystallization of material within the memory cell, mobile carrier density of material within the memory cell, and cycling endurance of the memory cell; or the read control circuit contemplates the one or more drift conditions by altering reference sense levels associated with a read circuit based on the contemplated one or more drift conditions; or the read control circuit contemplates the one or more drift conditions by altering one or more of a bit line and word line biasing based on the contemplated one or more drift conditions; or the read control circuit contemplates the one or more drift conditions by performing a periodic refresh of at least a portion of the memory array after an elapsement of a predetermined time period.

9. The system of claim 8, wherein the memory cell comprises a binary state or multi-level phase change memory cell.

10. A memory, comprising:

a memory array;

a drift condition sense system configured to ascertain one or more drift conditions associated with the memory array;

a read control circuit configured to effectuate a read operation of a memory cell in the array based on at least one ascertained drift condition provided by the drift condition sense system; and wherein:

the drift condition sense system comprises one or more counters configured to count a number of write cycles associated with one or more respective portions of the memory array; or the drift condition sense system comprises a timer configured to ascertain an amount of time since the memory cell was last programmed; or the read control circuit is further configured to alter one or more of a bit line and word line biasing to effectuate a read operation of a memory cell in the array based on at least one ascertained drift condition provided by the drift condition sense system.

* * * * *